(12) United States Patent
Liang

(10) Patent No.: US 7,354,293 B2
(45) Date of Patent: Apr. 8, 2008

(54) FASTENING POSITIONING DEVICE FOR A HANDLE OF A POWER SUPPLY

(75) Inventor: Chien-Fa Liang, Chung-Ho (TW)

(73) Assignee: Ablecom Technology, Inc., San Jose, CA (US)

( * ) Notice: Subject to any disclaimer, the term of this patent is extended or adjusted under 35 U.S.C. 154(b) by 215 days.

(21) Appl. No.: 11/353,101

(22) Filed: Feb. 14, 2006

(65) Prior Publication Data

US 2007/0186378 A1   Aug. 16, 2007

(51) Int. Cl.
*H01R 13/64* (2006.01)
(52) U.S. Cl. .................................. 439/372; 361/727
(58) Field of Classification Search ............... 439/345, 439/372; 361/724–727
See application file for complete search history.

(56) References Cited

U.S. PATENT DOCUMENTS

| | | | |
|---|---|---|---|
| 5,654,873 A * | 8/1997 | Smithson et al. | 361/685 |
| 5,668,696 A * | 9/1997 | Schmitt | 361/685 |
| 5,694,290 A * | 12/1997 | Chang | 361/685 |
| 5,791,753 A * | 8/1998 | Paquin | 312/332.1 |
| 6,040,981 A * | 3/2000 | Schmitt et al. | 361/695 |
| 6,203,076 B1 * | 3/2001 | Wytcherley et al. | 292/202 |
| 6,222,736 B1 * | 4/2001 | Sim et al. | 361/727 |

* cited by examiner

*Primary Examiner*—Khiem Nguyen
(74) *Attorney, Agent, or Firm*—Lowe Hauptman Ham & Berner, LLP

(57) ABSTRACT

A fastening positioning device for a handle of a power supply, including:
  a power supply having a rectangular outer case;
  a handle structured from upper and lower arms and a grip;
  a spring piece;
  a clasp groove defined on a side surface of the outer case, which enables the protruding portion to clasp therein;
  shaft pins that respectively penetrate the shaft holes and into the respective pivot joint holes defined in the surfaces of the outer case;
whereby the handle is firmly positioned on the outer case without the worry that application of an inappropriate external force will cause malposition of the handle on the outer case, and protruding bulk of the handle positioned to the outer case is considerably reduced.

4 Claims, 4 Drawing Sheets

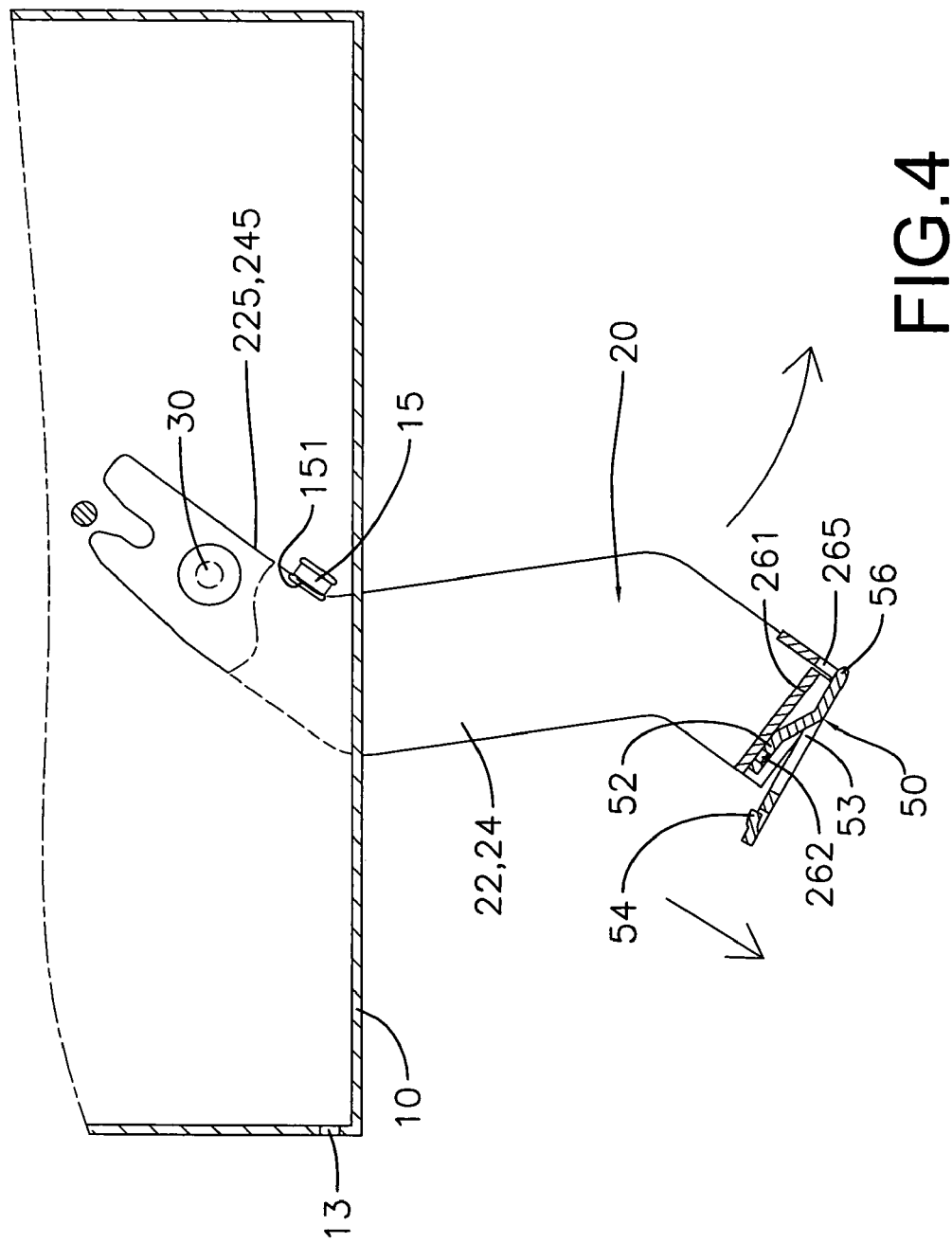

FASTENING POSITIONING DEVICE FOR A HANDLE OF A POWER SUPPLY

BACKGROUND OF THE INVENTION (a) Field of the Invention

The present invention relates to a fastening positioning device for a handle of a power supply, and more particularly to a fastening positioning device that enables effective and rapid assembling and disassembling of a handle to an outer case of a power supply, thereby enabling firm positioning of the handle to the outer case without the worry that application of an inappropriate external force will cause malposition of the handle on the outer case. Moreover, protruding bulk of the handle positioned to the outer case is considerably reduced.

(b) Description of the Prior Art

A prior art power supply is designed with a handle having a squared-off U-shape ("staple" shape) that is fixed to an outer case of the power supply by a fixed or movable means, which have the following shortcomings after a long period of use: the handle forms a considerable protuberance if affixed to a side panel of the power supply, and if subjected to dragging or impact from an external force, it very easily results in coincident abnormal displacement of the power supply. Moreover, the handle protruding from the outer case is extremely non-aesthetically appealing to the eye.

SUMMARY OF THE INVENTION

A primary objective of the present invention is to provide a fastening positioning device for a handle of a power supply that uses limited clockwise and anticlockwise angular rotation of a handle on an outer case and an elastic deformable spring piece to enable easy clasping of a protruding portion into a clasp groove or removing of the protruding portion from the clasp groove pre-defined in the outer case, while realizing extremely firm positioning of the handle on the outer case without the worry of possible malpositioning of the handle on the outer case from application of an inappropriate external force.

Another objective of the present invention is to provide the fastening positioning device for a handle of a power supply, wherein the greatest part of the bulk of upper and lower arms of the handle lie close to and are positioned on upper and lower surfaces of the outer case respectively, thereby minimizing the amount of bulk of the upper and lower arms protruding from the outer shell.

To enable a further understanding of said objectives and the technological methods of the invention herein, brief description of the drawings is provided below followed by detailed description of the preferred embodiments.

BRIEF DESCRIPTION OF THE DRAWINGS

FIG. 4 shows another cross-sectional schematic view depicting movement of the present invention.

DETAILED DESCRIPTION OF THE PREFERRED EMBODIMENTS

Figure 1:
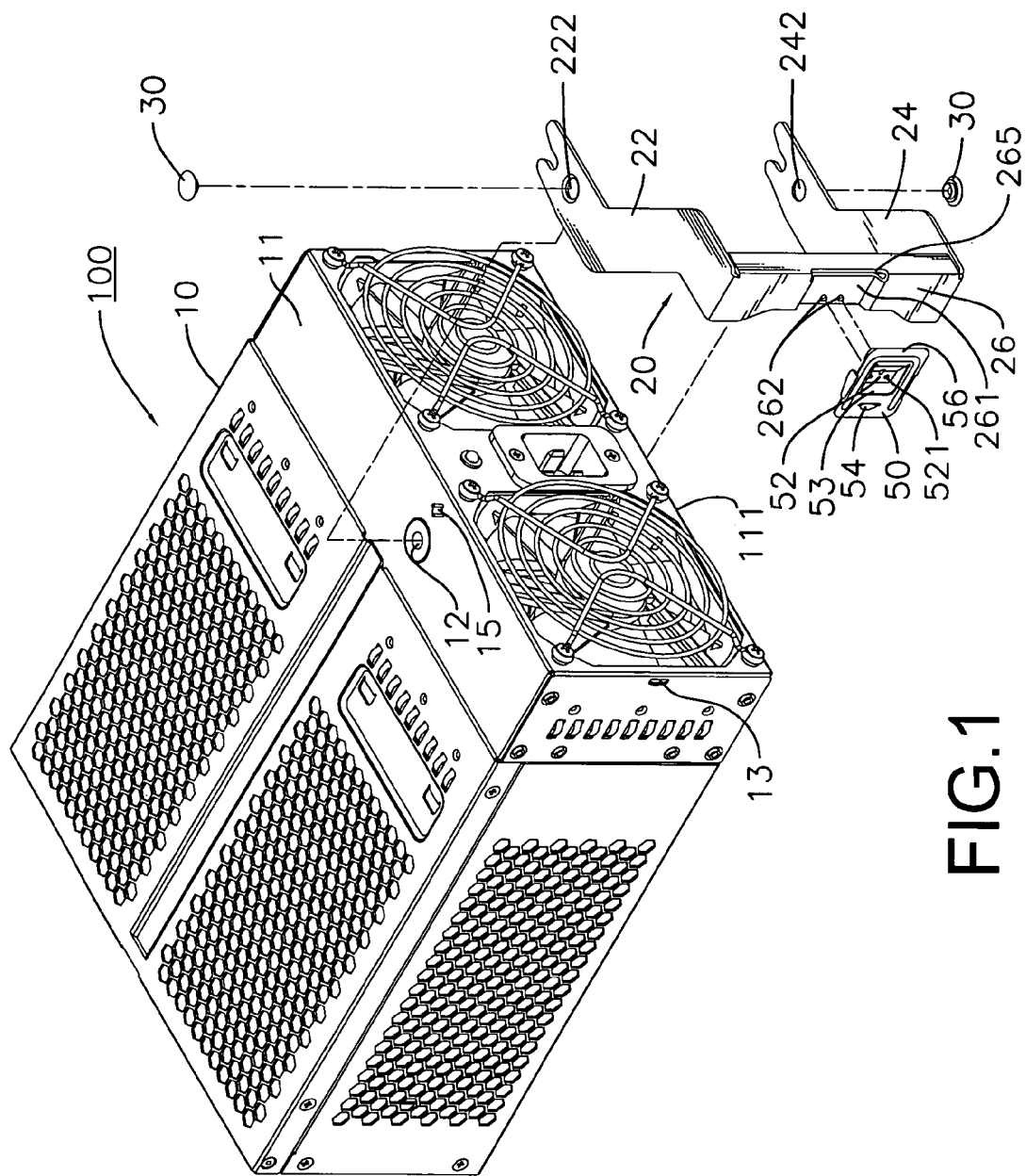
FIG. 1 shows an exploded elevational view depicting component members according to the present invention.
Figure 2:
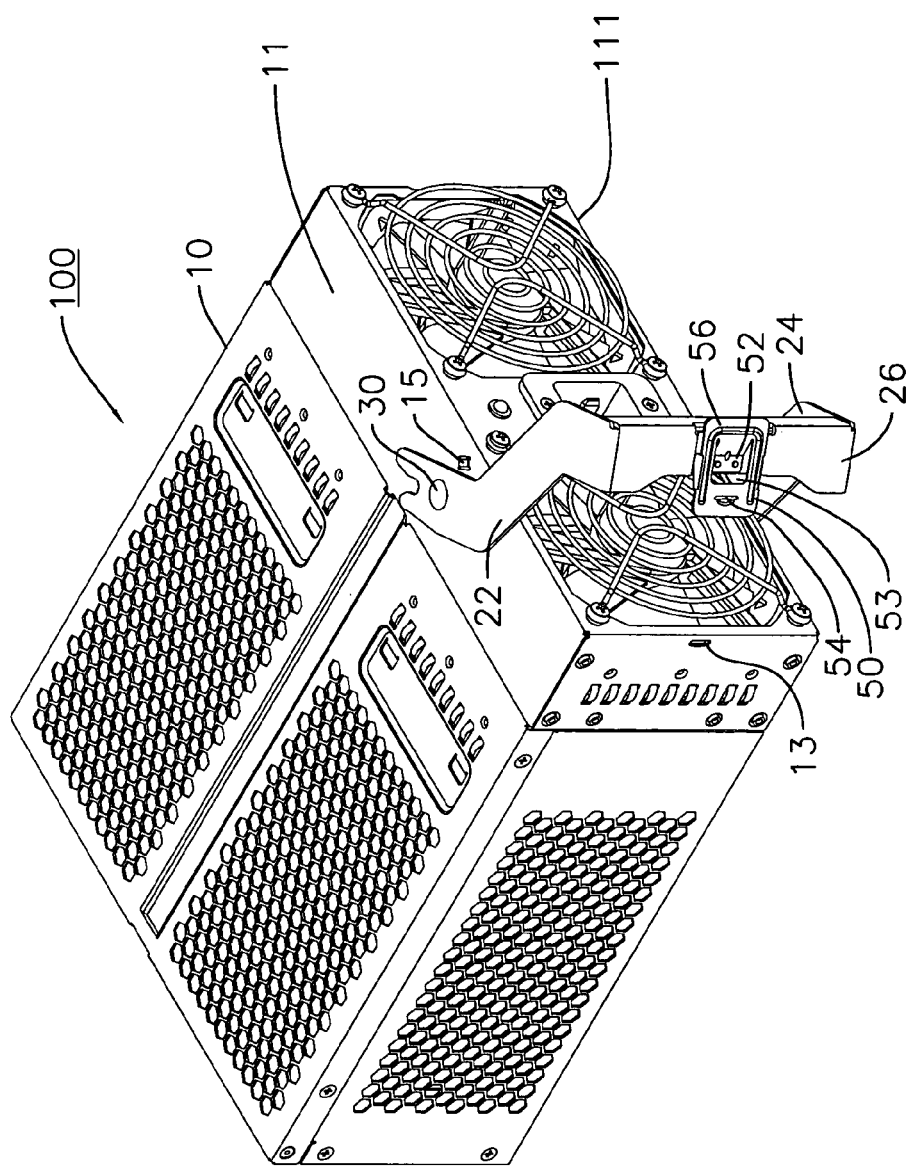
FIG. 2 shows an assembled elevational view according to the present invention.

Referring to FIGS. 1 and 2, which show the fastening positioning device for a handle of a power supply of the present invention, comprising:

a power supply 100 having a rectangular outer case 10, pivot joint holes 12, (12) are respectively defined in upper and lower surfaces 11, 111 of the outer case 10, a handle 20 structured from horizontally distributed upper and lower arms 22, 24 and a vertical grip 26, wherein two shaft holes 222, 242 are defined in rear ends of the upper and lower arms 22, 24 respectively, and a recess 261 is defined in an outer surface of the grip 26 of the handle 20;

a spring piece 50, interior of which is configured an inwardly inclined fixed piece 52 that is fixed in the recess 261, and a periphery of the fixed piece 52 forms a narrow through hole 53, a protruding portion 54 is stamped out of a front portion of the spring piece 50, thereby causing the protruding portion 54 to protrude out from an inner surface of the spring piece 50; the spring piece 50 is formed by stamping an elastic deformable metallic material.

a clasp groove 13 defined on a side surface of the outer case 10, which enables the protruding portion 54 to clasp therein;

two shaft pins 30, (30) that respectively penetrate the two shaft holes 222, 242 and into the respective pivot joint holes 12, (12) defined in the upper and lower surfaces 11, 111.

Referring to FIGS. 1 and 4, wherein a position fixing protuberance 15 is configured on the upper surface 11 or the lower surface 111 of the outer case 10. The position fixing protuberance 15 is provided with a side surface 151.

At least one side edge 225, 245 of the upper and lower arms 22, 24 abuts against the side surface 151.

Referring to FIG. 1, wherein a chamfer is formed on a side of the recess 261 of the handle 20, thereby creating an inclined concave surface 265 thereat.

A rear side surface of the spring piece 50 forms a press portion 56, which when subjected to pressure causes elastic displacement of the inclined concave surface 265.

Referring to FIG. 1, wherein protruding pins 262 are configured in the recess 261 of the handle 20.

Connecting holes 521 are defined in the fixed piece 52, which enable the protruding pins 262 to connect therein, thereby fixing the spring piece 50 within the recess 261.

Referring to FIGS. 1 and 2, wherein an upper arm 22 and a lower arm 24 are of identical shape, and assume a slightly ladder-shaped form. A user is able to grasp a grip 26 of a handle 20 with his hand, and regardless of whether pulling the handle away from an outer case 10 or drawing it up close to the outer case 10, the handle 20 can be rotated through a limited angle with shaft pins 30, (30) serving as rotating axes.

Figure 3:
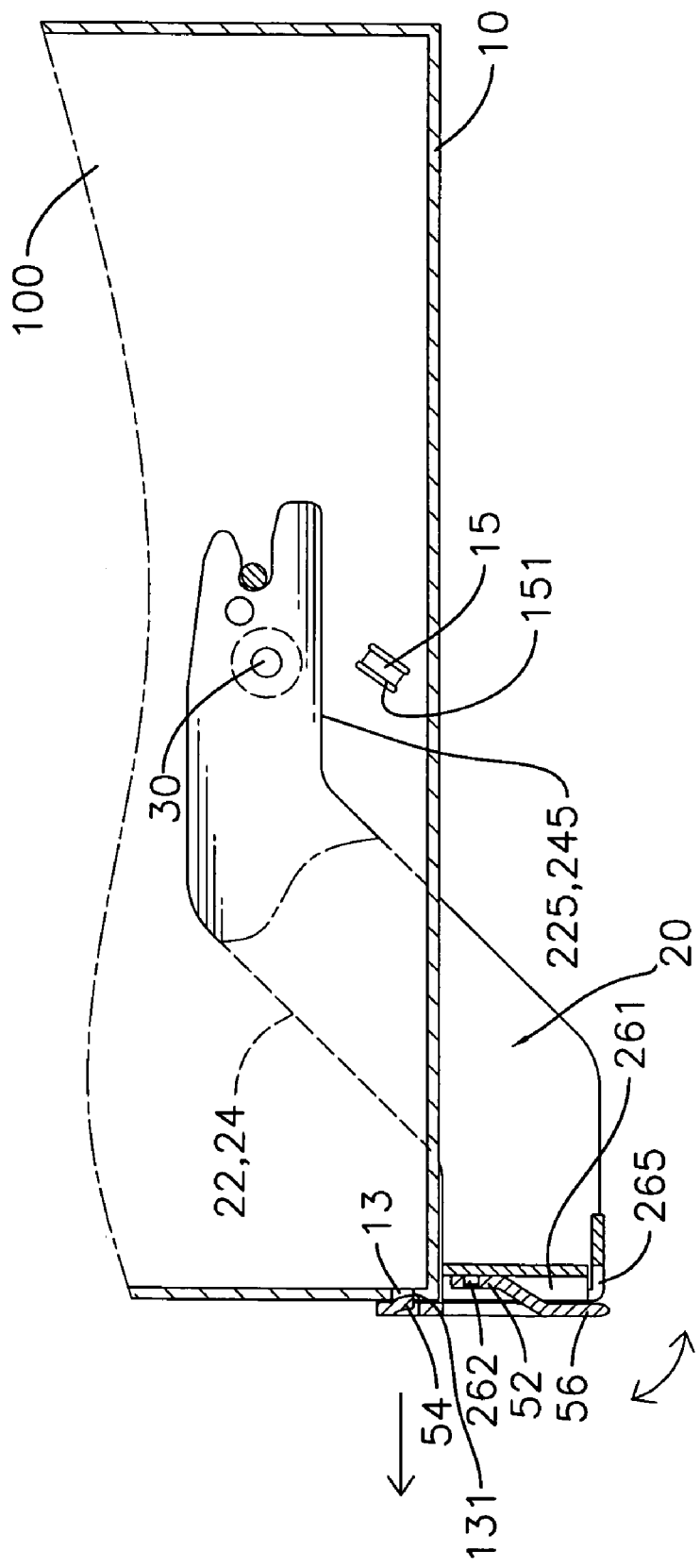
FIG. 3 shows a cross-sectional schematic view depicting movement of the present invention.

Referring to FIG. 3, which shows a protruding portion 54 clasped within a clasp groove 13, thereby ensuring a secure fixing of the handle 20 to the outer case 10.

Referring to FIGS. 1 and 4, a user grasps the grip 26, and presses a press portion 56 at a rear end of a spring piece 50 with his fingers, thereby causing the press portion 56 to inwardly displace and approach an inclined concave surface 265. A fixed piece 52 remains fixed, and because of the design of a narrow through hole 53, thus, a front end of the spring piece 50 easily elastic deforms and outwardly tilts, which further causes the protruding portion 54 to separate from the clasp groove 13 (see FIGS. 3 and 4). The user grasping the grip 26 applies an outward force to the handle 20, thereby causing the handle 20 to rotate about the shaft pins 30 serving as rotating axes, until side edges 225, 245 of the upper and lower arms 22, 24 respectively abut against side surfaces 151 of respective position fixing protuberances 15, at which time the handle 20 is protruding out from the outer case 10, and enables the user to carry or horizontally pull a power supply 100.

Referring to FIGS. 2 and 3, the spring piece 50 is an elastic metallic piece. When an operator grasps the grip 26 with his hand and rotates the handle 20 clockwise, the handle 20 is angular rotated about the shaft pins 30 serving as rotating axes. When the spring piece 50 makes contact with a side edge of the outer case 10, the operator presses the press portion 56 with his fingers, thereby causing the spring piece 50 to elastic deform about the fixed piece 52 as a fixed portion, and design of the narrow through hole 53 enables easy deformation of the spring piece 50 when force is applied. The applied force is released after the spring piece 50 is in full contact with the outer case 10, thereby enabling the protruding portion 54 to be clasped within the clasp groove 13 and fixedly positioned to a clasp groove wall 131 thereof. Hence, most of the bulk of the upper and lower arms 22, 24 equally lie on the upper surface 11 and the lower surface 111 of the outer case respectively, thereby keeping the handle 20 from protruding from the outer case 10, and achieving fixedly clasping of the entire handle 20 to the outer case 10 by means of the protruding portion 54 clasped within the clasp groove 13. If by any chance the handle 20 is subjected to an inappropriate external force (such as being knocked against or dragged by the human body or clothing), the user need not worry that the handle 20 will become malpositioned on the outer case 10.

Referring to the FIGS. 1, 2 and 4, the operator needs only to press the press portion 56 with his fingers to cause the spring piece 50 to again elastic deform and displace the protruding portion 54 out of the clasp groove 13. The operator can then outwardly rotate the handle 20 through an angle in an anticlockwise direction about the shaft pins 30 serving as rotating axes with his hand, until the side edges 225, 245 abut against the side surfaces 151, whereupon the handle 20 is opened from its fixed position and protrudes from the outer case 10. The handle 20 can then be used to carry or pull the power supply 100.

In conclusion, the handle 20 of the present invention can be effectively clamped within a clasp groove 13 when it is not needed, thereby achieving functionality to realize immobility of the handle 20. When the handle 20 is needed, a user can easily manipulate the handle to rotate and move it away from the outer case 10, thereby achieving extremely convenient and fast manual operation.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A fastening positioning device for a handle of a power supply, comprising:
   a power supply having a rectangular outer case, pivot joint holes are respectively defined in upper and lower surfaces of the outer case;
   a handle structured from horizontally distributed upper and lower arms and a vertical grip, wherein two shaft holes are respectively defined in rear ends of the upper and lower arms, and a recess is defined in an outer surface of the grip of the handle;
   a spring piece, interior of which is configured an inwardly inclined fixed piece that is fixed in the recess, and a periphery of the fixed piece forms a narrow through hole, a protruding portion is stamped out of a front portion of the spring piece, thereby causing the protruding portion to protrude out from an inner surface of the spring piece; the spring piece is formed by stamping an elastic deformable metallic material;
   a clasp groove defined on a side surface of the outer case, which enables the protruding portion to clasp therein;
   two shaft pins that respectively penetrate the two shaft holes and into the respective pivot joint holes defined in the upper and lower surfaces.

2. The fastening positioning device for a handle of a power supply according to claim 1, wherein a position fixing protuberance is configured on the upper surface or the lower surface of the outer case, and the position fixing protuberance is provided with a side surface;
   at least one side edge of the upper and lower arms abuts against the side surface.

3. The fastening positioning device for a handle of a power supply according to claims 1 or 2, wherein a chamfer is formed on a side of the recess of the handle, creating an inclined concave surface;
   a rear side surface of the spring piece forms a press portion, which when subjected to pressure causes elastic displacement of the inclined concave surface.

4. The fastening positioning device for a handle of a power supply according to claims 1 or 2, wherein protruding pins are configured in the recess of the handle;
   connecting holes are defined in the fixed piece, which enable the protruding pins to connect therein, thereby fixing the spring piece within the recess.

* * * * *